United States Patent [19]

Albon et al.

[11] Patent Number: 5,102,509
[45] Date of Patent: Apr. 7, 1992

[54] PLATING

[75] Inventors: John M. Albon, Stevenage; Wendy J. Davis, Cambridge; Peter E. Skinner; Stephen G. Warren, both of Royston, all of United Kingdom

[73] Assignee: Johnson Matthey Public Limited Company, London, United Kingdom

[21] Appl. No.: 599,254

[22] Filed: Oct. 15, 1990

Related U.S. Application Data

[63] Continuation of Ser. No. 403,875, Sep. 7, 1989, abandoned.

[30] Foreign Application Priority Data

Sep. 7, 1988 [GB] United Kingdom ............... 8821005

[51] Int. Cl.⁵ .............................................. C25D 3/56
[52] U.S. Cl. ..................................... 205/257; 205/264
[58] Field of Search ............................ 204/44.6, 47

[56] References Cited

U.S. PATENT DOCUMENTS

| 1,779,436 | 10/1930 | Keitel | 204/47 |
|---|---|---|---|
| 1,991,995 | 2/1935 | Wise | 204/47 |
| 3,206,382 | 9/1965 | Wilson et al. | 204/47 |
| 4,427,502 | 1/1984 | Abys | 204/44 |
| 4,493,754 | 1/1985 | Abys et al. | 204/47 |

OTHER PUBLICATIONS

K. Schumpelt, "The Electrochemical Soc.", Paper 80-40, pp. 549-558, (1941).
Morrissey, R., "Metal Finishing 55th Guidebook Directory Issue 1987", p. 267, (1987).

*Primary Examiner*—John Niebling
*Assistant Examiner*—Steven P. Marquis
*Attorney, Agent, or Firm*—Stevens, Davis, Miller & Mosher

[57] ABSTRACT

An effective bath for plating platinum or platinum alloys contains a complexed platinum (II) salt in which the anion component is a group or radical derived from an organic acid or inorganic acid other than a hydrohalic acid, in alkaline aqueous solution. The bath is more efficient and stable than known baths and permits good plating deposits to be achieved.

7 Claims, No Drawings

PLATING

This application is a continuation of application Ser. No. 403,875, filed Sept. 7, 1989 now abandoned.

This invention concerns improvements in plating, more especially it concerns platinum plating.

Precious metals are used as films on surfaces for a variety of reasons. In the jewellery trade precious metals, including platinum, are used to improve the appearance of an article and to create special effects. Platinum may be used as a film to protect metals and other materials from corrosion as in the coating of bursting discs. Platinum films are also used to provide conducting paths in electrical circuits. Platinum films can have more than one use in a particular application, such as with platinised titanium electrodes, where the platinum film acts as an electrical conductor and also protects the titanium, allowing the electrodes to be used in corrosive environments. Platinised surfaces may also have a catalytic function, for example, in the reduction of the hydrogen overpotential of anodes. A further application of platinum films is where they are reacted with components of the substrate or with additional materials to create reaction products as in the coating of turbine blades and subsequent treatment to form the erosion and corrosion resistant platinum aluminide. Platinum alloy films may also be formed and treated in this way.

Electroplated films find many other applications in, for example, the metallurgical and biological fields.

Conventionally platinum and platinum alloy films may be electro-deposited from a number of aqueous systems which are optimised for the particular application.

Such processes are based on materials such as diammine dinitroplatinum (II) (platinum 'P' salt), alkali metal hexahydroxyplatinates (IV), hydrogen hexachloroplatinate (IV) and hydrogen dinitrosulphatoplatinate (II) (DNS).

The processes exhibit a variety of problems in use—including difficulties of control, low efficiency, extremes of pH (acidity and alkalinity), precipitation of undesirable substances, loss of conductivity, and highly stressed films, especially when the film thickness exceeds five microns. Because of these factors each system is normally optimised for a small number of specific applications, and many product variants have to be marketed.

Due to the strongly alkaline or acidic nature of some of the existing materials, they may be considered as hazardous. Dangers may also arise in some cases if materials are allowed to dry out due to the explosive nature of the products formed. In addition, strongly alkaline or acidic plating baths can cause serious corrosion of substrates to be plated as well as plant components.

Extensive use of additives to the bath such as conducting salts, buffers, brighteners and materials to improve the throwing power can enhance the control difficulties. The addition of replenishers may alter the balance of the species present in the bath leading to changes in the nature of the deposited films.

A system or systems for the electrodeposition of platinum or platinum alloy films which overcome or improve upon a number of the difficulties described above is therefore highly desirable.

The present invention provides a platinum or platinum-alloy electroplating bath comprising an alkaline aqueous solution of a complexed platinum (II) salt, the anion component of the salt being one or more groups or radicals derived from an organic acid or an inorganic acid other than a hydrohalic acid.

The invention further provides the use of a complexed platinum (II) salt as defined above as a component in an electroplating bath for the plating of platinum or platinum alloys.

The invention also provides a process for the electroplating of platinum or a platinum alloy onto a conductive substrate, comprising the use in the plating bath of a complexed platinum salt as defined above, in alkaline aqueous solution.

Some of the complexed platinum salts are believed to be novel; these may be prepared by methods known per se. Suitable complexing ligands are nitrogen, and phosphorus- and oxygen-containing ligands, examples being ammonia and amines, including primary, secondary and tertiary amines and substituted amines. Phosphines may also be considered. Chelating oxygen-containing ligands, such as citrate, will also form suitable platinum complexes. Desirably, the ligand is selected by its ability to remain complexed with platinum in solution or in isolated salt form, but to permit deposition of platinum onto a substrate under electroplating conditions. Routine testing will ascertain whether a ligand meets the requirements of the user. The preferred ligand is ammonia. The anionic component of the salt may be selected from such inorganic acid groups as phosphate, hydrogen phosphate, tetraflouroborate, sulphamate, sulphate, nitrate (although particular care needs to be taken because of the danger of forming explosive substances), carbonate and the like. Suitable organic anions include those derived from acyclic or cyclic carboxylic acids, including hydroxy acids and dibasic acids, sulfonic and sulfamic acids, thiocarboxylic acids and imidic acids. Preferred organic acid anions include lactate, benzoate, citrate and tartrate. The particular anionic component(s) is/are selected to be beneficial to the plating application envisaged, and it should not interfere with the plating process by chemical attack on the platinum metal or alloy, or on the substrate.

According to the invention, the anionic component(s) assist conductivity of the plating bath and render the bath self-buffering.

The baths of the invention are alkaline, and the pH may be varied within the stability range of the chosen platinum complex salt and any other necessary components such as alloying metal complexes and/or salts. In general, good results may be obtained at pH's above 8.5. Although there does not appear to be a critical upper limit on pH, it is desirable to avoid high pH's, and the preferred range is from 10.0 to 10.5.

The plating baths of the invention are surprisingly stable and versatile. Platinum alloy deposits may be achieved by incorporating sources of selected precious or base metals, such as tetramminepalladium (II) chloride or hexamminenickel (II) chloride, and other suitable metal sources.

The addition of so-called brighteners to plating baths is generally known to improve the finish of plating deposits. We have found that some anionic components used according to the invention enable the plating process to yield bright white lustrous deposits suitable for jewellery applications. It is therefore not necessary to deliberately add brighteners in these cases.

The baths of the invention may include other components providing that these do not adversely affect the bath or the plating process. Although not found to be necessary generally, certain ions may be present to increase conductivity of the bath. Typically, these are soluble ions which do not interfere with the electroplating process such as the alkali metal ions (Na, K and Li), which are also stable under the preferred process conditions. The deliberate addition of a buffer system to maintain the pH of the bath is also unnecessary, because the baths have been found to be self-buffering.

The concentration of the platinum complex salt may vary, and may be measured as platinum from 0.005 molar (1 g/liter) to 0.150 molar (30 g/liter) or more. Preferred platinum concentrations depend upon the plating rate, cell geometry and mode (vat or barrel), degree of agitation etc., but are typically around 0.025 molar (5 g/liter) to 0.100 molar (20 g/liter) for most normal operations. Tests have shown that if the process of the invention is operated so as to deplete the platinum from solution (so as to recover residual platinum), the bath will still plate at a platinum concentration of less than 10 parts per million.

Preferably, the plating temperature is in the range 90° to 95° C., more preferably 91° to 95° C., for maximum efficiency, for a preferred system operating at optimum PH. Lower temperatures can be used for some of the systems as these baths continue to function at 60° C., although with reduced efficiency and adhesion.

Suitable substrates for plating are generally metal and alloy surfaces and other conducting surfaces. Typical metal surfaces are copper, gold, nickel, titanium and tungsten. Typical alloy surfaces are stainless steels, nickel alloys and superalloys containing niobium, zirconium and vanadium. Other surfaces include conductive resins and composites. The surfaces may be prepared for plating by the use of conventional cleaning procedures.

The electroplating cell may utilize conventional or specialized anodes, as with existing electroplating systems, including graphite, platinum and platinised titanium (insoluble) or platinum (soluble).

Current densities for plating according to the invention are suitably in the range 0.03–10 A dm$^{-2}$, preferably 0.10 to 1.55 A dm$^{-2}$.

It has been found in prototype work that the plating efficiencies of the baths of the invention are higher than previously known platinum plating baths, under the preferred conditions. The baths are particularly easy to use, being consistent and stable over long periods of operation. It has also been found that the complex salt is stable in concentrated solution. Solid (isolated) forms have been prepared. This permits the supply of such forms to users, who may then dilute to a desired bath concentration. In the case of the solid form, the user will, after dissolution of the solid, have to adjust the pH, suitably using sodium hydroxide solution. Ammonia solution may be added if the desired solution is of tetrammine type. During use, the baths of the invention may be replenished in a variety of ways, either by the addition of concentrated forms of the solution or by adding solid forms of the salt.

The invention will now be described by way of example only.

EXAMPLE 1

Tetrammineplatinum (II) dihydroxide [Pt(NH$_3$)$_4$](OH)$_2$, prepared by known methods, is a convenient starting material, and is reacted with the chosen anion radical or mixture of anions in the form of the corresponding acid.

5 g of platinum as tetrammineplatinum (II) dihydroxide solution is reacted with the stoichiometric amount of orthophosphoric acid, to form tetrammine platinum (II) hydrogen orthophosphate. 5 g of disodium hydrogen orthophosphate dihydrate is added to the solution, which is stirred until the solid has dissolved. The pH of the solution is adjusted with sodium hydroxide solution to pH 10.5 and the whole is made up to 1 liter with demineralised water to form a ready-to-use plating bath solution at 92° C.

EXAMPLES 2 AND 3

Using the same procedure, salts were prepared utilising citric acid and sulfamic acid, and plating baths were prepared.

EXAMPLE 4

The plating bath of the Example 1, was tested for efficiency in plating copper in a conventional electroplating cell, at various temperatures, at pH 10.4 and at a constant 5 g/liter of platinum. The results are tabulated below for such a working system:

| Temperature (°C.) | Efficiency |
| --- | --- |
| 70 | 2 |
| 75 | 2 |
| 80 | 4 |
| 85 | 7 |
| 90 | 60 |

The efficiencies are the percentage of platinum deposited on the substrate compared to that calculated by Faraday's Law under the same conditions. At 2 g/liter platinum content, the efficiencies are maintained at the above level, but below 2 g/liter, efficiencies begin to decline. A 100% (theoretical) efficient platinum bath will deposit 0.0607 grams of platinum per ampere minute.

The efficiencies found were on average more than double those obtainable with a known bath containing platinum 'P' salt, in the 91° C.–95° C. region.

EXAMPLE 5

The plating baths prepared in Examples 1 to 3 were used to plate nickel, gold, gold alloy (9 ct gold), niobium and nickel superalloys, graphite and stainless steel and titanium. Adherent deposits of platinum were obtained in thicknesses of 5 to 10 microns. Thicknesses of greater than 25 microns have been obtained on titanium and stainless steel.

Plating was successfully carried out on a variety of physical forms of substrates, including plates and coupons, gauze, chain, wire and preformed and fabricated items.

EXAMPLE 6

The bath of Example 1 was used to plate 5 microns of platinum onto a copper plate substrate. The adhesion of the deposit was tested using a Sebastian Adhesion Tester, and survived a pull normal to the plated surface of over 4,200 psi (16,536 kN/m$^2$).

EXAMPLE 7

Platinum films were deposited at thicknesses of 2.5 microns onto copper panels using hydrogen orthophosphate and citrate as anions. The films were extremely ductile, and the panels could be bent through 180° without shedding or exfoliation along the bend. Bright deposits plated using these baths do not finger mark and are not highly porous.

Additional experimental work indicates that the baths of the invention are capable of being taken through a large number of turnovers. A turnover is the plating out of all the platinum originally in the bath, followed by replenishment using concentrated bath solution. The baths were capable of satisfactory plating after ten turnovers.

EXAMPLE 8

A plating bath was prepared in identical manner to that of Example 1, except that 30 g of platinum was used instead of 5 g. The bath was tested and gave a cathode efficiency of 75% at a current density of 1.53 A dm$^{-2}$.

EXAMPLE 9

A plating bath of 5 g per liter of platinum as diamminebis (diethylamine) platinum (II) orthophosphate, at pH 10 and operating at a temperature of 78° C. and a current density of 0.23 A dm$^{-2}$, gave a cathode efficiency of 67%.

EXAMPLE 10

A plating bath of 5 g per liter of platinum as tetrammineplatinum (II) sulphamate, at pH 10.2, and operating at a temperature of 93° C. and a current density of 0.25 A dm$^{-2}$, gave a cathode efficiency in the range of 75 to 85%.

EXAMPLE 11

A plating bath of 5 g per liter of platinum as tetrammineplatinum (II) citrate, at pH 9.0, and operating at a temperature of 80° C. and a current density of 0.25 A dm$^{-2}$, gave a cathode efficiency in the range 45 to 55%.

EXAMPLE 12

A plating bath of 2.5 g per liter of platinum as dismminebis (diethylamine) platinum (II) orthophosphate and 2.5 g per liter of palladium as a compatible palladium (II) complex, at pH 8.2, and operating at a temperature of 63° C., was used to electro-deposit a film onto a copper coupon. X-ray analysis confirmed the presence of both platinum and palladium in the film.

We claim:

1. A process for the electroplating of platinum or a platinum alloy film onto a conductive substrate, comprising the steps of providing a platinum or platinum-alloy electroplating bath comprising a dissolved tetramine complexed platinum (II) salt, the anion component of the salt being one or more groups or radicals selected from orthophosphate, hydrogen orthophosphate, phosphate, hydrogen phosphate, sulphate, carbonate, lactate, citrate, tartrate, sulphamate and tetrafluoroborate, and a complexing ligand being ammonia in water, said bath having a pH above 8.5 and operating said bath at a temperature of 90° C. to 95° C.

2. A process as claimed in claim 1, having a pH in the range 10.0 to 10.5.

3. A process as claimed in claim 1, operated at a current density of 0.10 to 1.55 amps per sq decimeter of substrate surface.

4. A process as claimed in claim 1, in which the platinum concentration of the bath is from 1.0 g per liter to 30 g per liter.

5. A process as claimed in claim 1, wherein the anion component is selected from the group consisting of orthophosphate, hydrogen orthophosphate, phosphate and hydrogen phosphate.

6. A process as claimed in claim 5, wherein the anion component is selected from the group consisting of phosphate and hydrogen phosphate.

7. A process as claimed in claim 1, wherein the plating bath temperature is from 91° C. to 95° C.

* * * * *